(12) United States Patent
Curtin et al.

(10) Patent No.: US 7,487,484 B2
(45) Date of Patent: *Feb. 3, 2009

(54) METHOD, SYSTEM AND STORAGE MEDIUM FOR DETERMINING CIRCUIT PLACEMENT

(75) Inventors: James J. Curtin, Fishkill, NY (US); Ray Raphy, Poughkeepsie, NY (US); Stephen Szulewski, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

This patent is subject to a terminal disclaimer.

(21) Appl. No.: 11/466,120

(22) Filed: Aug. 22, 2006

(65) Prior Publication Data
US 2006/0277515 A1    Dec. 7, 2006

Related U.S. Application Data

(63) Continuation of application No. 10/890,463, filed on Jul. 12, 2004, now Pat. No. 7,120,888.

(51) Int. Cl.
*G06F 17/50* (2006.01)
(52) U.S. Cl. ............... 716/6; 716/9; 716/10; 703/16
(58) Field of Classification Search ........... 716/6, 716/9, 10; 703/16
See application file for complete search history.

(56) References Cited

U.S. PATENT DOCUMENTS

| | | | |
|---|---|---|---|
| 5,148,383 A * | 9/1992 | Jaeger | 708/319 |
| 5,218,551 A | 6/1993 | Agrawal et al. | |
| 5,237,514 A | 8/1993 | Curtin | |
| 5,521,837 A | 5/1996 | Frankle et al. | |
| 5,555,188 A | 9/1996 | Chakradhar | |
| 5,608,645 A | 3/1997 | Spyrou | |
| 5,663,888 A | 9/1997 | Chakradhar | |
| 5,666,290 A * | 9/1997 | Li et al. | 716/8 |
| 5,815,406 A * | 9/1998 | Golla et al. | 716/7 |
| 6,086,631 A | 7/2000 | Chaudhary et al. | |
| 6,099,583 A | 8/2000 | Nag | |

(Continued)

FOREIGN PATENT DOCUMENTS

JP    20002245110 A    8/2002

OTHER PUBLICATIONS

NB82081720, "I/O Pin Assignment in a Computer", IBM Technical Disclosure Bulletin, vol. 25, No. 3B, Aug. 1, 1982, pp. 1720-1724 (6 pages).

(Continued)

*Primary Examiner*—Phallaka Kik
(74) *Attorney, Agent, or Firm*—Cantor Colburn LLP; Lynn Augspurger

(57) ABSTRACT

A method for determining placement of circuitry during integrated circuit design. The method includes accessing a net list identifying circuitry connections. A plurality of individual net weights are assigned to nets in timing paths within the net list, the individual net weights being valid irrespective of physical design parameters. A composite net weight is determined for said timing paths, the composite net weight being in response to the plurality of individual net weights. Initial placement of the circuitry is determined in response to the composite net weight.

7 Claims, 10 Drawing Sheets

U.S. PATENT DOCUMENTS

| | | | |
|---|---|---|---|
| 6,233,724 B1 | 5/2001 | LaBerge | |
| 6,292,926 B1 | 9/2001 | Fukui et al. | |
| 6,397,170 B1 | 5/2002 | Dean et al. | |
| 6,480,991 B1* | 11/2002 | Cho et al. | 716/8 |
| 6,493,854 B1* | 12/2002 | Chowdhury et al. | 716/6 |
| 6,507,937 B1 | 1/2003 | Tetelbaum | |
| 6,507,938 B1* | 1/2003 | Roy-Neogi et al. | 716/10 |
| 6,598,209 B1 | 7/2003 | Sokolov | |
| 6,601,226 B1 | 7/2003 | Hill et al. | |
| 6,622,291 B1* | 9/2003 | Ginetti | 716/9 |
| 6,836,753 B1* | 12/2004 | Silve | 703/2 |
| 6,944,840 B2 | 9/2005 | Sasaki et al. | |
| 6,952,816 B2 | 10/2005 | Gupta et al. | |
| 7,000,210 B2 | 2/2006 | Wu et al. | |
| 7,013,445 B1 | 3/2006 | Teig et al. | |
| 7,013,450 B2* | 3/2006 | Teig et al. | 716/13 |
| 7,036,104 B1* | 4/2006 | Alpert et al. | 716/10 |
| 7,039,891 B2* | 5/2006 | Tetelbaum | 716/13 |
| 7,137,093 B2* | 11/2006 | Harn | 716/10 |
| 7,308,664 B1* | 12/2007 | Fung et al. | 716/6 |
| 7,313,778 B1* | 12/2007 | Stenz et al. | 716/17 |
| 2001/0032331 A1* | 10/2001 | LaBerge | 716/18 |
| 2003/0005398 A1* | 1/2003 | Cho et al. | 716/8 |
| 2003/0159118 A1 | 8/2003 | Lindkvist | |
| 2003/0159121 A1* | 8/2003 | Tseng | 716/8 |
| 2003/0226122 A1* | 12/2003 | Hathaway et al. | 716/2 |
| 2003/0229873 A1* | 12/2003 | Casavant | 716/6 |
| 2004/0068708 A1 | 4/2004 | Sivaraman et al. | |
| 2004/0068711 A1 | 4/2004 | Gupta et al. | |
| 2004/0088671 A1 | 5/2004 | Wu et al. | |
| 2005/0034091 A1 | 2/2005 | Harn | |
| 2005/0050497 A1* | 3/2005 | Tetelbaum | 716/6 |
| 2005/0081175 A1* | 4/2005 | Scott et al. | 716/12 |
| 2005/0120319 A1* | 6/2005 | van Ginneken | 716/6 |
| 2005/0138578 A1* | 6/2005 | Alpert et al. | 716/2 |
| 2005/0278681 A1* | 12/2005 | Hossain et al. | 716/17 |
| 2006/0010413 A1 | 1/2006 | Curtin et al. | |
| 2006/0095879 A1* | 5/2006 | Brahme et al. | 716/6 |
| 2008/0112441 A1* | 5/2008 | Hathaway et al. | 370/519 |

OTHER PUBLICATIONS

Chuang et al., "Timing and Area Optimization for Standard-cell VLSI Circuit Design", IEEE Transactions on Computer-Aided Design of Integrated Circuits and Systems, vol. 14, No. 3, Mar. 1995, pp. 308-320.

Xi et al., "Useful-Skew Clock Routing with Gate Sizing for Low Power Design", Proceedings of 33rd Design Automation Conference, Jun. 3, 1996, pp. 383-388.

* cited by examiner

METHOD, SYSTEM AND STORAGE MEDIUM FOR DETERMINING CIRCUIT PLACEMENT

CROSS-REFERENCE TO RELATED APPLICATIONS

This application is a continuation of U.S. patent application Ser. No. 10/890,463 filed Jul. 12, 2004, the entire contents of which are incorporated herein by reference.

BACKGROUND OF THE INVENTION

The invention relates to integrated circuit design and in particular to circuit placement to improve initial placement of circuits and timing driven placement of circuits. Chip design is a multi-variate design optimization problem. To enable ASIC and semi-custom chip designs to meet their design targets, a number of different design resources (architecture choices, logic synthesis, chip floorplanning, automated placement, circuit power level selection, buffer insertion, timing optimization logic transforms, etc) are brought to bear and expended in a sequence of design optimization steps and iterative feedback loops to achieve design closure.

The traditional methodology approach to chip design optimization and target convergence has involved an insular sequential application of design resources directed to achieve the greatest immediate improvement in the design state. Thus, design resources are applied in an amount and in an order that only marginally accounts for the interactions among those design resources. Depending on their nature, these interactions can promote or inhibit the convergence of the chip design to its design targets.

With increasing integration levels and signal frequencies, the interactions among design resources have become more significant. Designing future chips without regard to the synergistic application of design resources, will become an increasingly frustrating endeavor. Chip design schedules will lengthen, and some design targets will be regarded as unachievable even though a solution may exist. Thus, improvement is needed in the processes for chip design.

BRIEF SUMMARY OF THE INVENTION

Exemplary embodiments of the invention include a method for determining placement of circuitry during integrated circuit design. The method includes accessing a net list identifying circuitry connections. A plurality of individual net weights are assigned to nets within the net list, the individual net weights being valid irrespective of physical design parameters. A composite net weight is determined for the nets in timing paths, the composite net weight being in response to the plurality of individual net weights. Initial placement of the circuitry is determined in response to the composite net weight. Other embodiments include a computer program and system for implementing the method.

Additional exemplary embodiments of the present invention include a method for determining placement of circuitry during integrated circuit design. The method includes accessing a net list including circuitry connections. A post-placement slack net weight is assigned to timing paths within the net list. The post-placement slack net weight is proportional to a negative slack value increasing with increasing negative slack, and the slack net weight is inversely proportional to a positive slack value decreasing with increasing positive slack. Timing driven placement is performed of said circuitry in response to said slack net weight.

Further exemplary embodiments include a method for determining placement of circuitry during integrated circuit design. The method includes identifying critical paths connecting a source to critical sinks. A plurality of non-critical paths are identified connecting said source to a plurality of non-critical sinks. An isolation buffer is inserted between the source and the non-critical sinks to establish a path between the source and the isolation buffer while maintaining the critical paths between the source and the critical sinks.

BRIEF DESCRIPTION OF THE DRAWINGS

Referring now to the drawings wherein like elements are numbered alike in the several figures.

DETAILED DESCRIPTION OF THE PREFERRED EMBODIMENTS

Embodiments of the invention improve circuit placement during integrated circuit design by improving both initial placement and timing driven placement. If the initial placement results in a placement with poor quality, it will misdirect timing-driven placement by means of false or inaccurate net weight priorities. The techniques described herein improve both initial placement and timing driven placement. These techniques may be implemented on a computer executing a computer program for carrying out the processes described herein.

In determining initial placement of circuits, embodiments of the invention use a number of net weights to prioritize paths. Nets weights may be used to characterize the priority of nets and pins and thus the term net weight is not limited to nets, but include other circuit pin elements. Each of the net weights is valid irrespective of physical design parameters of the design (i.e., chip IMAGE and floorplan) so that the use of the net weights to drive initial placement remains valid no matter what the impact of the chip IMAGE and floorplan is on the resulting initial placement. The net weights are then combined into a composite net weight. Each net has a composite net weight indicating the placement priority of that net. Nets with highest composite net weights are given priority in placement so that the critical timing paths are accommodated.

Figure 1:
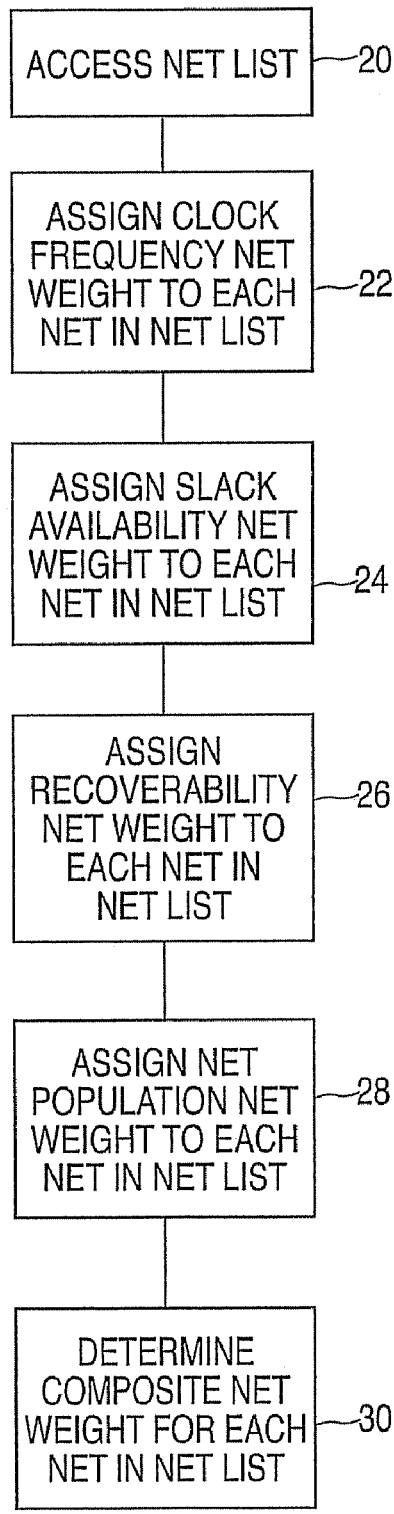
FIG. 1 is a flowchart of an exemplary process for assigning net weights in an embodiment of the invention.

FIG. 1 is a flowchart of a process for assigning net weights to paths to evaluate path criticality. At step 20, the net list is accessed. The net list contains a list of all circuitry interconnections and clock speeds for each path. For example, the net list may indicate that an output of a gate is captured by a latch at a certain clock frequency.

At step 22, a clock frequency net weight is assigned to nets and pins in paths in the net list. Existing initial placement routines do not consider clock frequency but are currently based on connectivity and circuit block occupation density. In existing routines, clock connections are deliberately ignored and detached during initial placement, so they have no influence on latch placement from either a connectivity or occupation density standpoint. As a result, in existing routines, latch placement is based solely on the data signal stream that the circuitry must process. The other input stream, the clock, is not considered.

By contrast, embodiments of the invention assign a clock frequency net weight to nets and pins in paths during the initial placement process. Clock frequencies place constraints on circuitry. For example, with respect to logic functions, higher frequencies reduce data path latencies, implying more restricted net length and placement area constraints for data path logic. With respect to latch distribution constraints, higher frequencies generally impose reduced clock latency and increased clock signal integrity requirements such as improved slew rate requirements, decreased minimum pulse widths and decreased clock arrival times. The clock frequency net weight is essentially proportional to the clock frequency. Thus, increasing clock frequency results in increased clock frequency net weight for that path. At step 22, each path is assigned a clock frequency net weight based on the associated clock for that path. In one example, the clock frequency net weight may be a linear function based on a constant multiplied by the clock frequency.

At step 24, a slack availability net weight is assigned to each net and pin in the net list. Depending on timing targets and the number and type of circuit blocks in a path, a path may have more or less slack availability. Path delay is a summation of logic block delay and placement related net delay. Subtracting pre-physical design logic block delay from the path delay timing target can give a relative assessment of the remaining path delay available for consumption by placement. This placement-available slack measure can be used to drive initial placement priorities by assigning a slack availability net weight to each net.

The slack availability places constraints on path components. With respect to logic functions, paths with less placement-available slack must complete their connections within a smaller aggregate path net length. With respect to latches, latches define the data path boundaries. Paths with less placement-available slack must also locate their latches closer, often within a smaller area.

Figure 2:
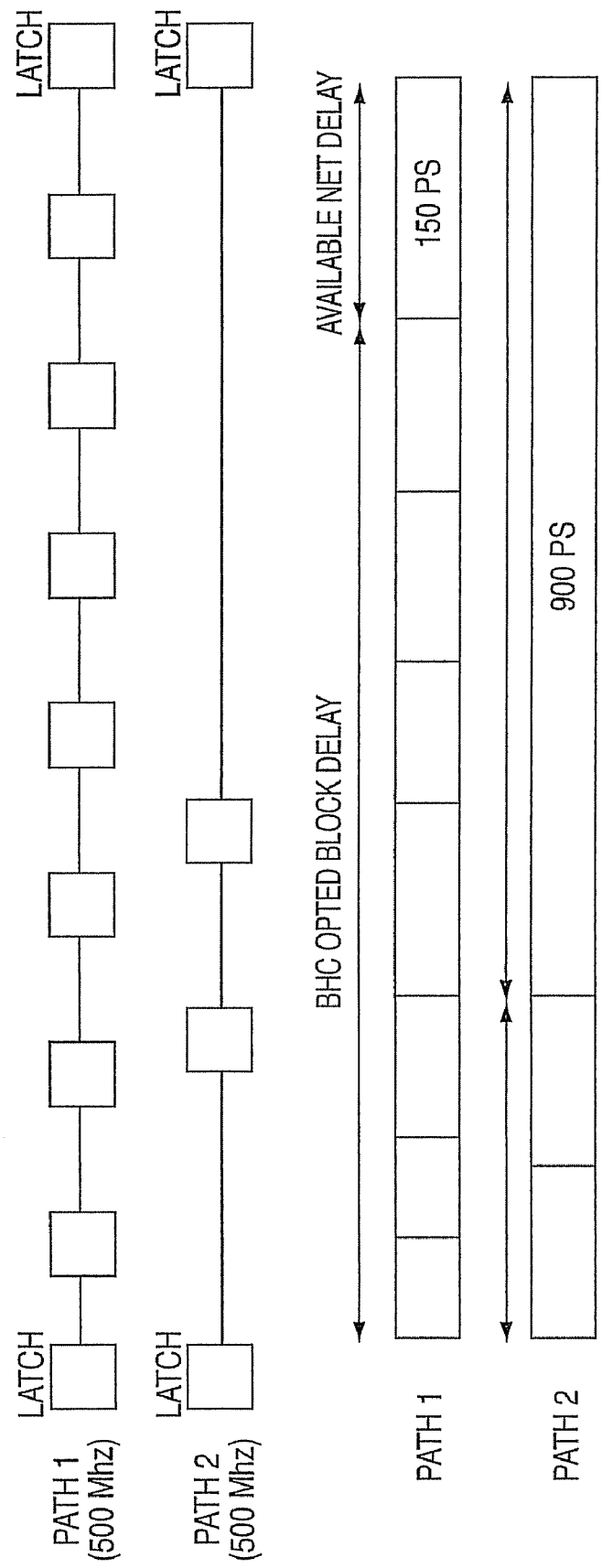
FIG. 2 depicts two paths having different slack availability.

FIG. 2 illustrates two paths shown as path 1 and path 2. Both paths have the same clock frequency, but path 1 has 7 circuit blocks between 2 latches connected by 8 nets. Path 2 has 2 circuit blocks between 2 latches connected by 3 nets. Circuit block delay represents the existing inherent delay associated with circuitry prior to placement. Net delay refers to delay attributable to a timing path that can be adjusted by circuit placement. Thus, the path having the more positive placement available slack is assigned a lower slack availability net weight. Conversely, the path having the less positive placement available slack is assigned a higher slack availability net weight.

At step 26, a recoverability net weight is assigned to each net and pin in the net list. The recoverability net weight is based on the recognition that some paths have components which are not optimizable. For example, certain on-chip delays cannot be altered such as hard macros, RAMs, cores, I/O books, etc. Off-chip delays also cannot be adjusted using on-chip design adjustments. Recognizing that certain path delay components cannot be optimized reduces the amount of design resource that can be brought to bear on optimizing the path and reduces its convergence potential. In order to compensate for a path's inability to be optimized, a recoverability net weight is assigned to each net in such paths.

Figure 3:
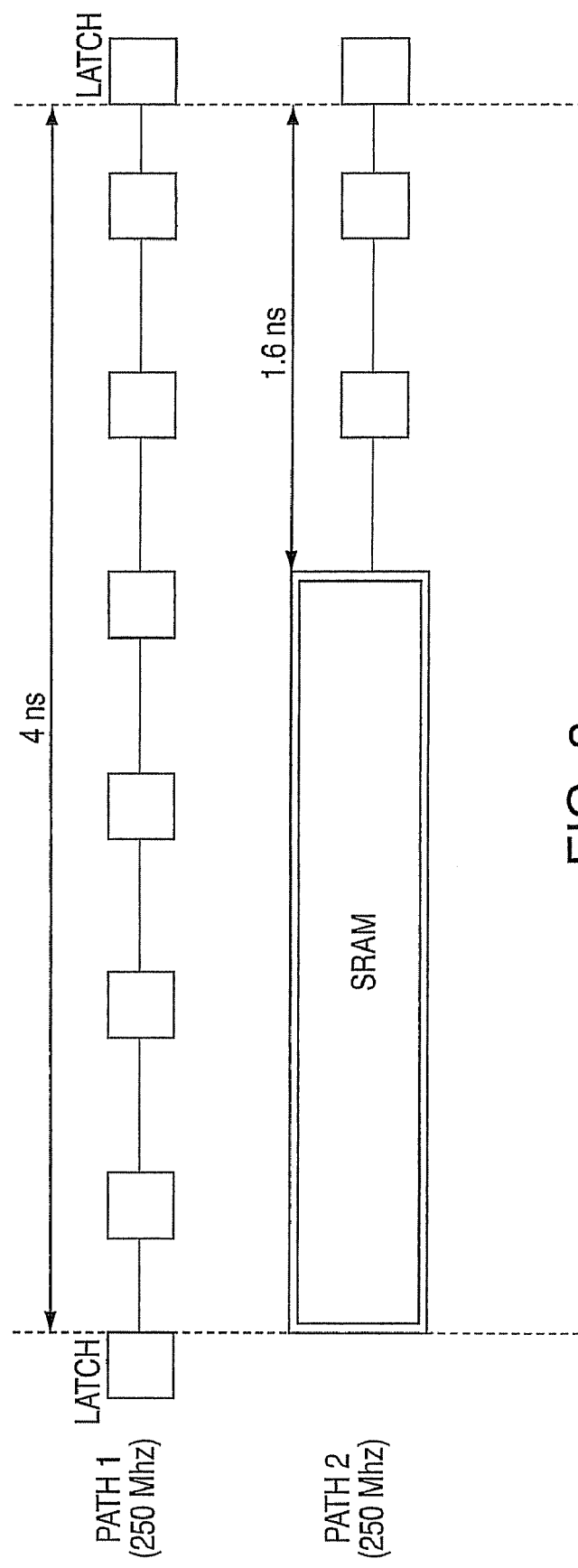
FIG. 3 depicts two paths having different recoverability.

FIG. 3 illustrates two paths having differing amounts of recoverability. Path 1 includes a number of circuits that may be optimized by altering the location of the circuits. Thus, path 1 includes 4 nanoseconds of delay all of which is potentially optimizable by adjusting circuit locations and/or applying optimization techniques. Path 2 includes an SRAM that has a 2.4 nanosecond non-optimizable access time; and additional circuits with potentially optimizable delay of 1.6 nanoseconds. Thus, path 2 has 2.4 nanoseconds of unoptimizable delay and 1.6 nanoseconds of potentially optimizable delay.

Figure 4:
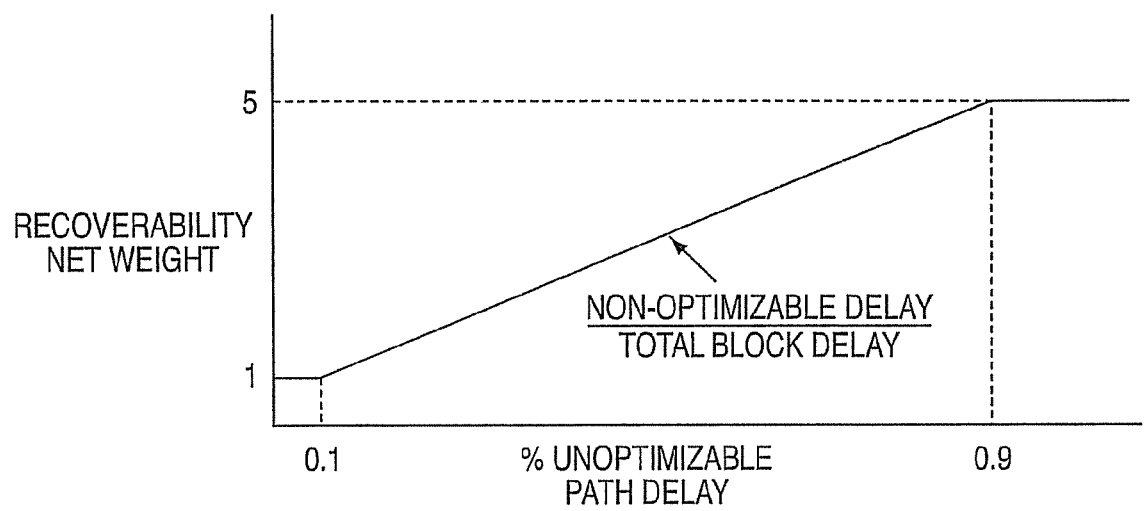
FIG. 4 depicts a plot of an exemplary recoverability net weight.

FIG. 4 depicts an exemplary function for determining a recoverability net weight for nets in a path. The function uses the ratio of non-optimizable delay to total path delay to define a recoverability net weight. In the example shown in FIG. 4, the recoverability net weight ranges from 1 to 5 as the percent of unoptimizable path delay increases.

At step 28, a net population net weight is assigned to each net and pin in the net list. The net population net weight is based on the number of nets within a path. Paths may be generally defined as the overall routes between primary inputs and latches, primary outputs and latches, and between two latches. A net is generally an entity that connects a logic block to other logic blocks.

In current practice, the slack of a path is assigned to each net within that path. Net weights are calculated for each net based on the slack assigned to the net. If a set of paths have the same slack, each net in the set of paths is assigned the same slack value and receives the same net weight. Assigning equal net weights to a set of nets implies equal emphasis in placement for each net in the set of nets. If different paths are composed of unequal numbers of nets, after placement some paths will have greater path delays than others even though their initial slack values and individual net placement emphases were the same. The path delay differences result because path delay is a function of the summation of net delays in the path. For equal length nets, paths composed of a greater number of nets, will have a greater delay. To compensate for this effect, embodiments of the invention use net population net weights to account for the net population differences among paths.

Among the effects of the net population differences are natural physical expansion of a path as a function of the number of nets in the path. This expansion behavior is a consequence of the equilibrium point solution of the quadratic placement algorithm.

Another effect of net population differences is based on fan out. Based on average fan out statistics for a chip, each net in a path interacts with other logic circuits on the chip. For an average fan out of 3, each net in a path will engage 2 other logic blocks not in the path being considered. If a path has 12 nets in it, it engages on average 24 extraneous logic blocks not in the path. If a path is composed of 3 nets, it interacts with only 6 extraneous blocks. Initial placement is a competition among nets. The greater the number of nets in a path, the greater the cumulative fan out of a path's nets. The more logic the path has to compete with, the more interdependencies must be dealt with in trying to optimize the path.

Still another effect of net population differences is based on path net delay. The probability of a path achieving a timing target will be directly related to the amount of placement design freedom each net in the path has. The smaller the average path allotted net delay, the smaller the average placement design freedom, and the lower the probability that a summation of the net delays in a path will remain within the path's timing constraint.

Figure 5:
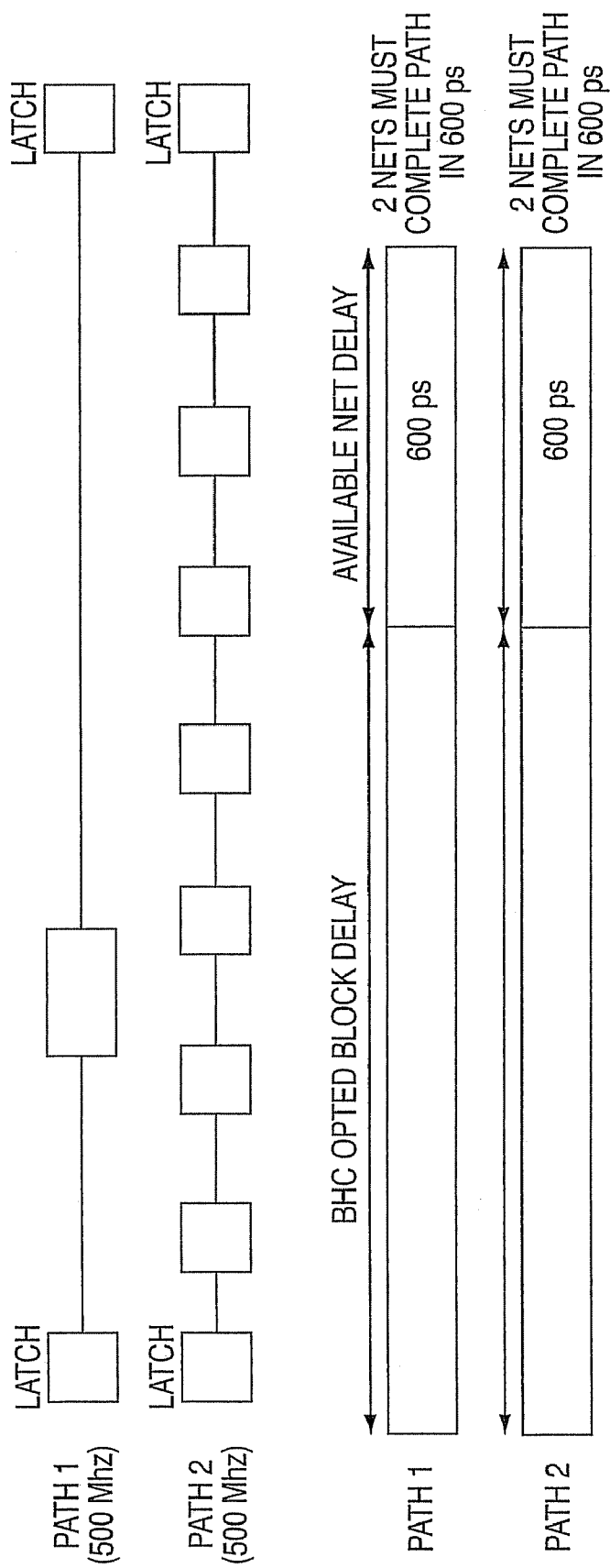
FIG. 5 depicts two paths having different net populations.

FIG. 5 depicts two paths having the same clock frequency and a different number of nets. Path 1 includes 2 nets while path 2 includes 8 nets. The available net delay is 600 picoseconds for each path, but path 2 requires that 8 nets complete within the 600 picoseconds. For path 1, only 2 nets must complete within the 600 picoseconds.

Figure 6:
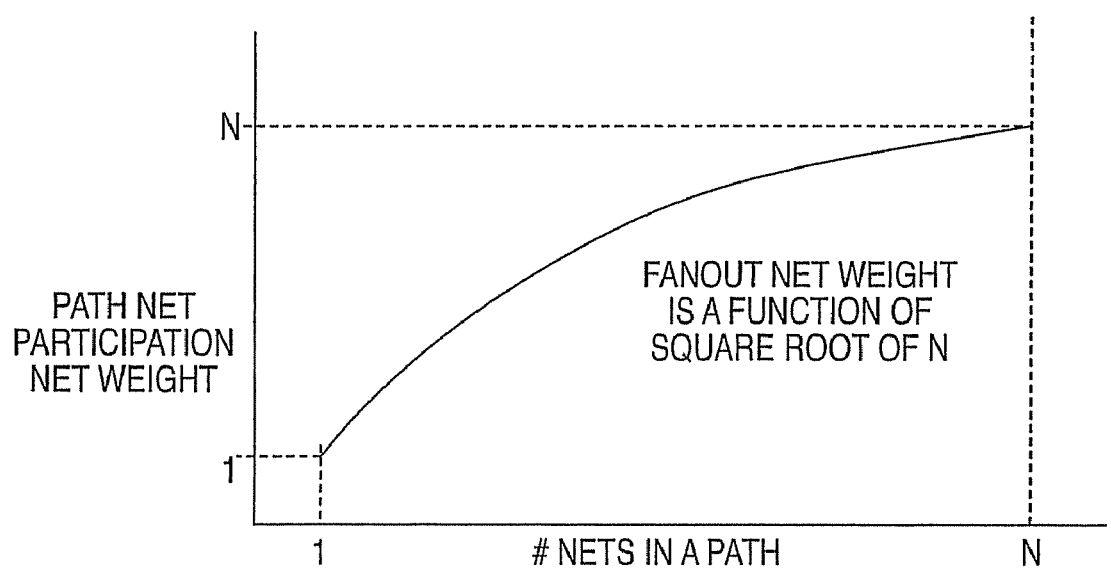
FIG. 6 depicts a plot of an exemplary net population net weight.

Given these effects of additional nets in the path, a net population net weight is used that is proportional to the number of nets in the path. In embodiments of the invention, the net population net weight is based on the square root of the number of nets in the path. For example, FIG. 6 shows a plot of a path net population net weight versus the number of nets in a path. As the number of nets in the path increases, the net population net weight also increases.

Once the clock frequency net weight, slack availability net weight, recoverability net weight and net population net weight are determined, the composite net weight is determined for each net at step 30. The composite net weight may be computed based on one or all of the individual net weights. As an example, the individual net weights may be multiplied to define the composite net weight. One or more of the individual net weights may be normalized or the composite weight may be normalized.

Once the composite weight is determined for the nets in the net list, the initial placement of circuitry may be prioritized. The nets having the higher composite net weights have higher placement priority.

Once the initial placement is performed, the next stage of the chip design process is timing driven placement. During timing driven placement, the composite net weights may be calculated based on post initial placement timing and may be used to characterize placement priority. Paths may have positive slack or negative slack. Positive slack indicates that the path completes its processing within the allocated time. Negative slack indicates that the path cannot complete its processing within the required timing. One goal of circuit placement is to have no paths with negative slack.

Figure 7:
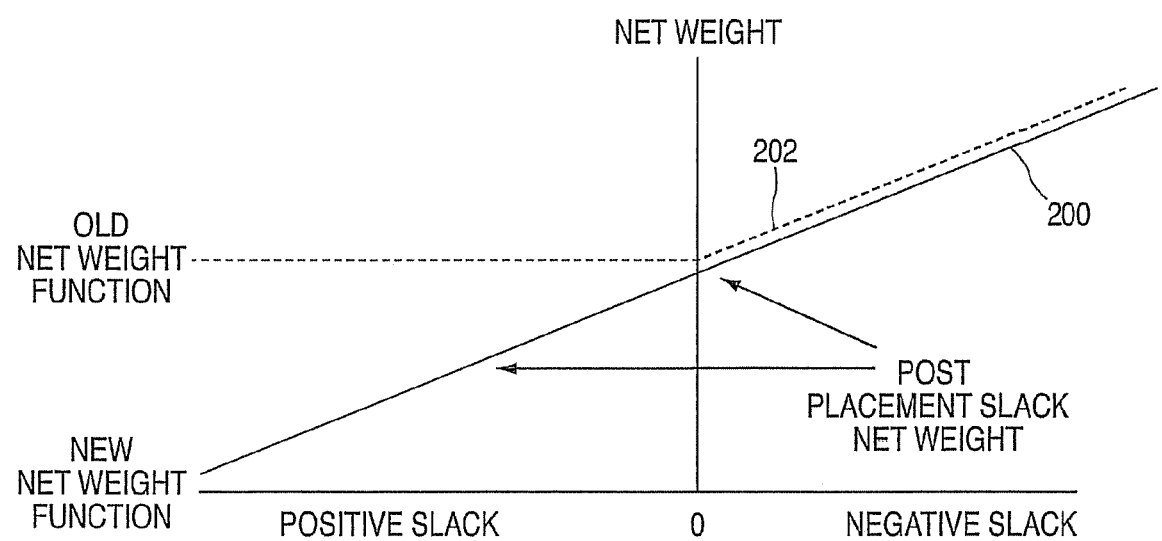
FIG. 7 depicts a plot of an exemplary slack net weight.

The management of positive slack is another feature used in embodiments of the invention. Slack is the difference between required arrival time of a signal in a path and the actual arrival time of the signal. Embodiments of the invention assign a slack net weight to paths dependent on the amount of positive or negative slack in that path. FIG. 7 depicts an exemplary slack weight that varies with the slack as indicated by line 200. The conventional slack net weight is also depicted in FIG. 7 as dashed line 202. The conventional slack weight treated all positive slack paths the same. That is, whether a path had 100 extra picoseconds or 1000 extra picoseconds, the slack net weight was the same.

The slack net weight function 200 adjusts the slack net weight in response to the amount of positive slack in an inversely proportional manner. That is, as positive slack increases the slack net weight decreases. For negative slack, the slack net weight increases with increased negative slack. The slack net weight is then used as a factor in timing driven placement. During timing driven placement, circuit placement is adjusted based on the net weights described above with reference to FIG. 1 and the slack net weight of FIG. 7.

Figure 8A:
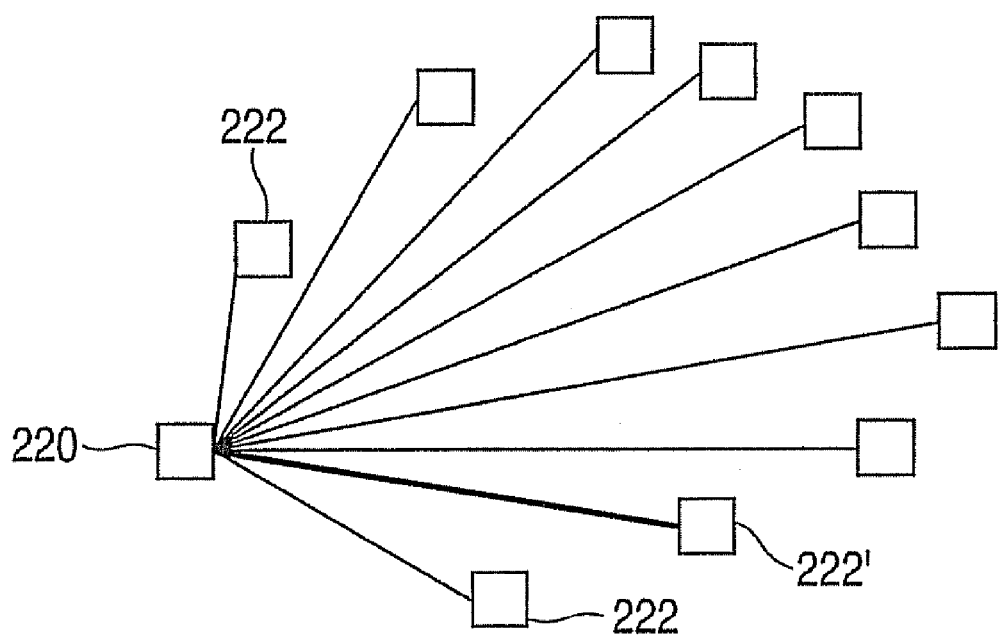
FIGS. 8A and 8B illustrate buffer insertion for isolating critical and non-critical nets.

The above described techniques use net weights to improve initial placement and timing driven placement. In other embodiments of the invention, the net list is modified to improve both initial placement and timing driven placement. In embodiments of the invention, buffers are inserted in the net list to provide isolation of critical sinks from non-critical sinks. FIG. 8A shows a source 220 connected to ten sinks 222. The path to critical sink 222' is a critical path. The RC load of all ten sinks prevents efficient signal timing to the critical path.

Multi-drop nets with a mix of critical and non-critical sinks such as that in FIG. 8A pose a dilemma. Assigning a high priority to all sinks in the net based on the criticality of the most critical sink will cause all of the sinks in the net to be considered critical. This is not desirable because the non-critical sinks' placements may exert an influence on other critical paths not related to the multi-drop net. This interdependency may cause these other critical paths to lengthen unnecessarily due to the excessive priority emphasis of the non-critical sinks. Assigning a low priority to all the sinks of the net based on the predominant slack value of the sinks will cause the critical path through the critical sink to be under emphasized during placement, lengthening this critical path.

In conventional methods, all sinks of a given net share a net weight based on the most critical path passing through the net. The most critical sink's priority is amplified by an additional factor; the creation of a temporary point to point connection, or net, between the driver book/pin and the most critical sink book/pin. This connection is called an attraction.

This attraction increases the emphasis on pulling the most critical sink closer to the net's driver book during placement. This attraction is invoked when the most critical sink's slack has a high variance from the net's sink group nominal slack value. This results in number of disadvantages. The critical path segment passing through the net is subjected to, and delayed by, the fall electrical parasitic load resulting from the cumulative capacitive load caused by all the sink pins in the net; and the RC delay caused by the amount of wire required to connect to all of the sinks in the net. Furthermore, other critical paths, which are indirectly connected to this critical path through interactions with the non-critical sinks of the net, can be forced to compete directly with this critical path, because the non-critical sinks are made to appear critical by the sharing of a net weight determined by the most critical sink.

Figure 8B:
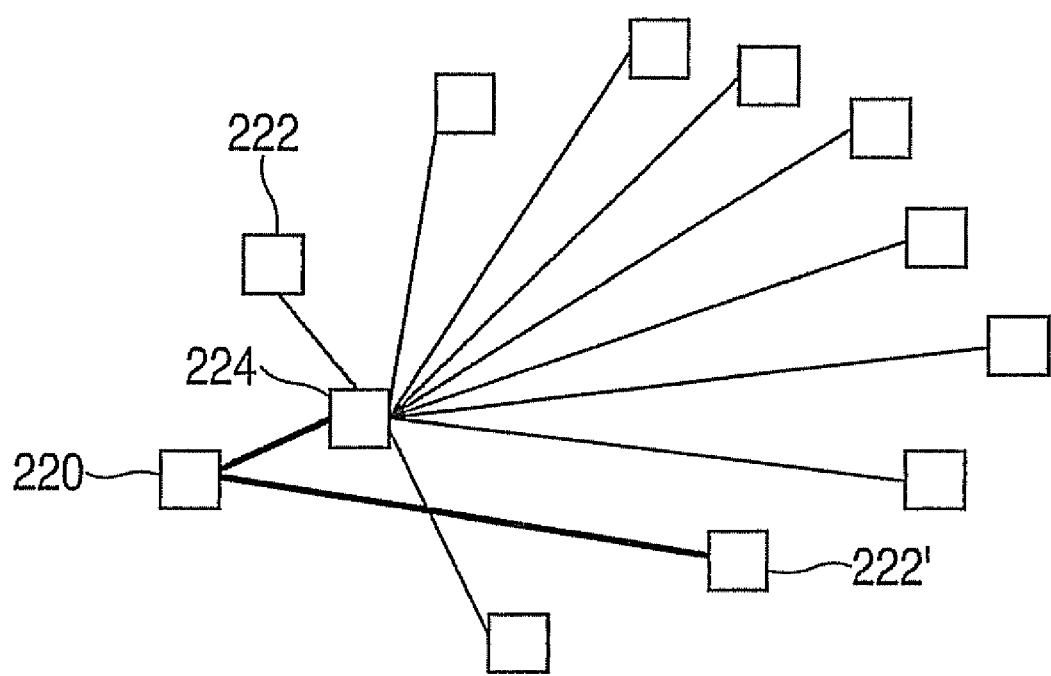

FIG. 8B depicts one technique to isolate critical sinks from non-critical sinks in embodiments of the invention. As shown in FIG. 8B, a buffer 224 is positioned between the source 220 and the non-critical sinks 222. This provides two direct connections to the source 220, one between source 220 and buffer 224 for the non-critical sinks and one between source 220 and critical sink 222'. This improves the timing to the critical sink 222' and also facilitates timing of other critical paths that may be influenced by placement of non-critical sinks. As noted above, the net list is modified to include the buffer 224 as a new component.

The imposition of isolation buffer 224 between the source 220 and the non-critical sinks 222 of the net provides several advantages. The critical path segment passing through the net is subjected to, and delayed by, the electrical parasitic load caused by the capacitive load produced by only two sink pins in the net, namely the most critical sink, which is in the critical path; and the isolation buffer sink. Further, the RC delay caused by only the amount of wire required to connect to the isolation buffer and the wire required by the critical path segment itself. The isolation buffer adds delay to the delay paths of the non-critical sinks, but this is not a problem. These paths are by definition non-critical, and can absorb a great deal of extra time delay before becoming timing violations. Because no critical sinks are part of the isolation buffer net, the net and its sinks can expand significantly. This expansion freedom allows other critical paths to optimize their timing with minimal impact on the critical path which was isolated by the isolation buffer. This effect of reducing the interaction probability among multiple critical paths, by means of isolation buffer insertion, has cumulative benefit as more and more critical paths are isolated. The freedom to optimize placement grows as each critical path to critical path interaction is minimized.

In determining which sinks 222 receive a direct connection to the source 220, the criticality of each sink is compared to a criticality threshold. This criticality threshold may be based on a percentage (e.g. 50%) of the highest criticality sink. If a sink has a criticality greater than the criticality threshold, then a direct connection is made from the source to that sink.

When adding direct connections to a source, factors such as fan out are addressed. In conventional routines, nets with a high fan out (e.g., over 100 nets) were ignored because the processing needed is intense. Embodiments of the invention determine if any critical sinks exist in network having high fan out. If no critical sinks are present, then the entire network is ignored with respect to making direct connections to a source. If critical sinks do exist, then direct connections are made from the critical sinks to the source, and the remaining non-critical sinks are ignored. The critical sinks may be determined by comparing sink criticality to a criticality threshold.

Figure 9:
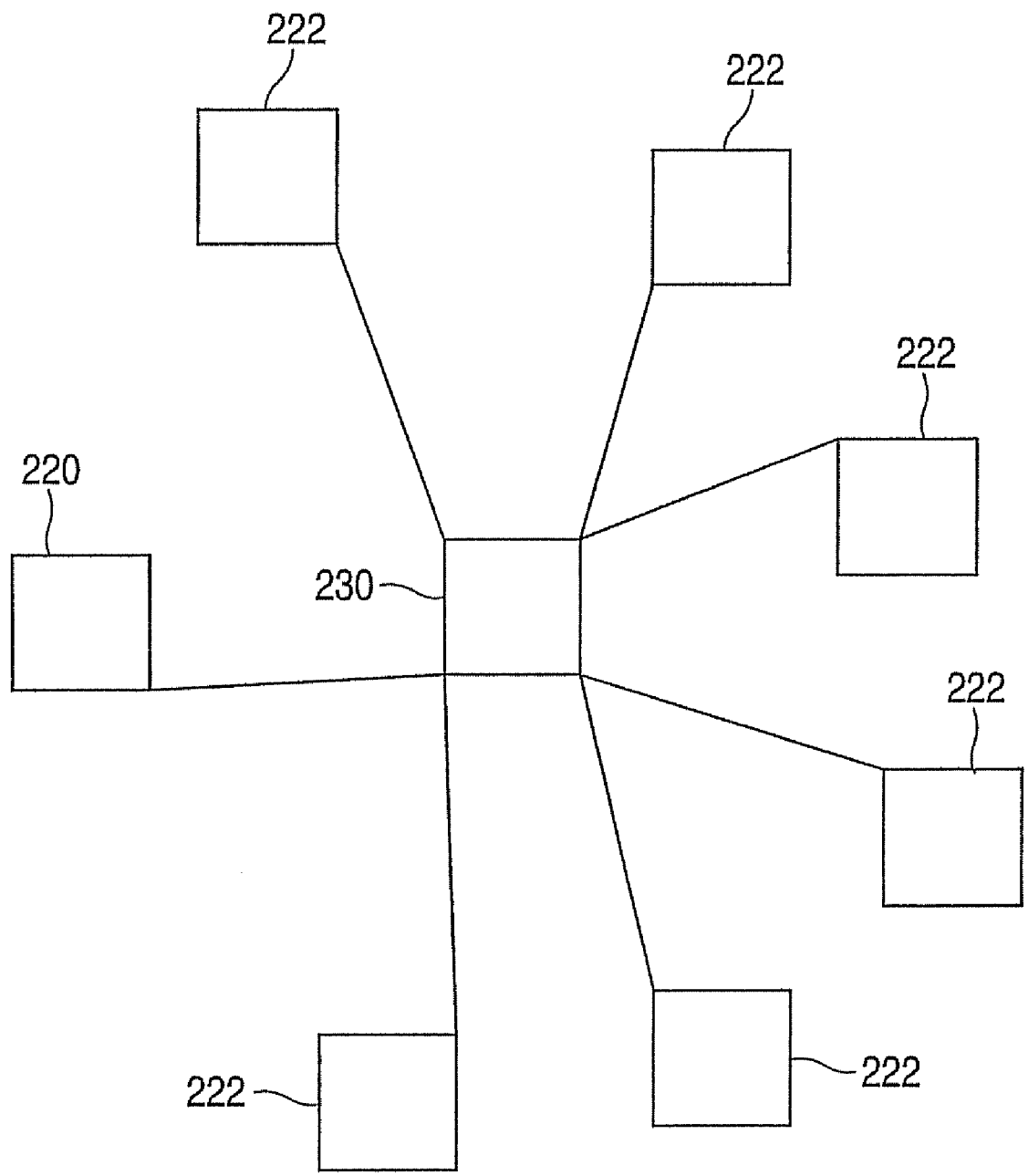
FIG. 9 illustrates a technique for achieving net equilibrium.

A feature that may be used in connecting sinks directly to a source is determining an equilibrium point for the connecting a driver to the sinks. This process is illustrated in FIG. 9 where a source 220 is to be connected to a number of sinks 222. To mimic the behavior of a clique model for the net, a book 230 is temporarily assigned as a connection point for all the sinks 222 and the source 220. The nets between the temporary book 230 and source 220 and temporary book 230 and sinks 222 are balanced to achieve an equilibrium so that each circuit connected to the net has a placement priority proportional to the slack requirement.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. An embodiment of the present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for determining placement of circuitry during integrated circuit design, the method comprising:

accessing a net list identifying circuitry connections;

assigning a plurality of individual net weights to nets in timing paths within said net list, said individual net weights being valid irrespective of physical design parameters;

determining a composite net weight for nets in said timing paths, said composite net weight being in response to said plurality of individual net weights;

determining initial placement of said circuitry in response to said composite net weight;

wherein said individual net weights include a clock frequency net weight proportional to a clock frequency of said timing path;

said individual net weights include a slack availability net weight inversely proportion to placement available slack in said timing path, said slack availability net weight being separate from the clock frequency net weight.

2. The method of claim 1 wherein:

said individual net weights include a net population net weight proportional to a number of nets in said timing path.

3. The method of claim 2 wherein:

said net population net weight is determined in response to a square root of said number of nets in said timing path.

4. A storage medium encoded with machine-readable computer program code for determining placement of circuitry during integrated circuit design, the storage medium including instructions for causing a computer to implement a method comprising:

accessing a net list identifying circuitry connections;

assigning a plurality of individual net weights to nets in timing paths within said net list, said individual net weights being valid irrespective of physical design parameters;

determining a composite net weight for nets in said timing paths, said composite net weight being in response to said plurality of individual net weights;

determining initial placement of said circuitry in response to said composite net weight;

wherein said individual net weights include a clock frequency net weight proportional to a clock frequency of said timing path;

said individual net weights include a slack availability net weight inversely proportion to placement available slack in said timing path, said slack availability net weight being separate from the clock frequency net weight.

5. The storage medium of claim 4 wherein:

said individual net weights include a net population net weight proportional to a number of nets in said timing path.

6. The storage medium of claim 5 wherein:

said net population net weight is determined in response to a square root of said number of nets in said timing path.

7. A system for determining placement of circuitry during integrated circuit design, the system comprising:

a computer executing a computer program and implement a method including:

accessing a net list identifying circuitry connections;

assigning a plurality of individual net weights to nets in timing paths within said net list, said individual net weights being valid irrespective of physical design parameters;

determining a composite net weight for nets in said timing paths, said composite net weight being in response to said plurality of individual net weights;

determining initial placement of said circuitry in response to said composite net weight;

wherein said individual net weights include a clock frequency net weight proportional to a clock frequency of said timing path;
said individual net weights include a slack availability net weight inversely proportion to placement available slack in said timing path, said slack availability net weight being separate from the clock frequency net weight.

* * * * *